United States Patent [19]
Kelton et al.

[11] Patent Number: 5,757,868
[45] Date of Patent: May 26, 1998

[54] DIGITAL PHASE DETECTOR WITH INTEGRATED PHASE DETECTION

[75] Inventors: James Robert Kelton, Oak Park; David Paul Gurney, Algonquin; Kevin Lynn Baum, Rolling Meadows, all of Ill.

[73] Assignee: Motorola, Inc., Schaumburg, Ill.

[21] Appl. No.: 726,727

[22] Filed: Oct. 7, 1996

Related U.S. Application Data

[63] Continuation of Ser. No. 197,087, Feb. 16, 1994, abandoned.

[51] Int. Cl.$^6$ .................................................. H03D 3/18
[52] U.S. Cl. ....................... 375/360; 375/328; 375/354; 375/375; 327/145; 327/151; 331/1 R
[58] Field of Search ............................... 375/358, 376, 375/327, 328, 324, 340, 351, 355, 357, 359, 360, 362, 364, 371, 373, 374, 375, 354; 329/304, 306, 307, 305, 309, 310; 326/93, 96, 99; 327/39, 41, 42, 43, 45, 48, 49, 144, 145, 151, 160, 156, 159; 331/55, 46, 1 R, 1 A, 18, 25

[56] References Cited

U.S. PATENT DOCUMENTS

| | | | |
|---|---|---|---|
| 3,843,931 | 10/1974 | Sarkilahti | 329/310 |
| 4,736,386 | 4/1988 | Nichols | 375/224 |
| 4,773,085 | 9/1988 | Cordell | 375/375 |
| 4,849,991 | 7/1989 | Arnold et al. | 375/330 |
| 5,084,669 | 1/1992 | Dent | 324/76.82 |
| 5,313,170 | 5/1994 | Kojima | 375/328 |
| 5,367,538 | 11/1994 | La Rosa et al. | 375/328 |
| 5,369,374 | 11/1994 | Kojima | 329/306 |

*Primary Examiner*—Wellington Chin
*Assistant Examiner*—William Luther
*Attorney, Agent, or Firm*—Darleen J. Stockley

[57] ABSTRACT

A digital phase detector 100 receives a limited input signal 108 and inputs it and a reference oscillation 112 into an EXCLUSIVE NOR gate 102. The output 110 of the EXCLUSIVE NOR gate 102 is input to a gated N-bit counter 104, which produces an N-bit representation of the magnitude of the phase 115 of the signal 108. A sign detector 105 determines the sign of the phase of the signal by sampling the resultant 110 and combines the magnitude of the phase 115 with the sign of the phase to produce a digital numeric representation of the phase of the signal 116.

8 Claims, 3 Drawing Sheets

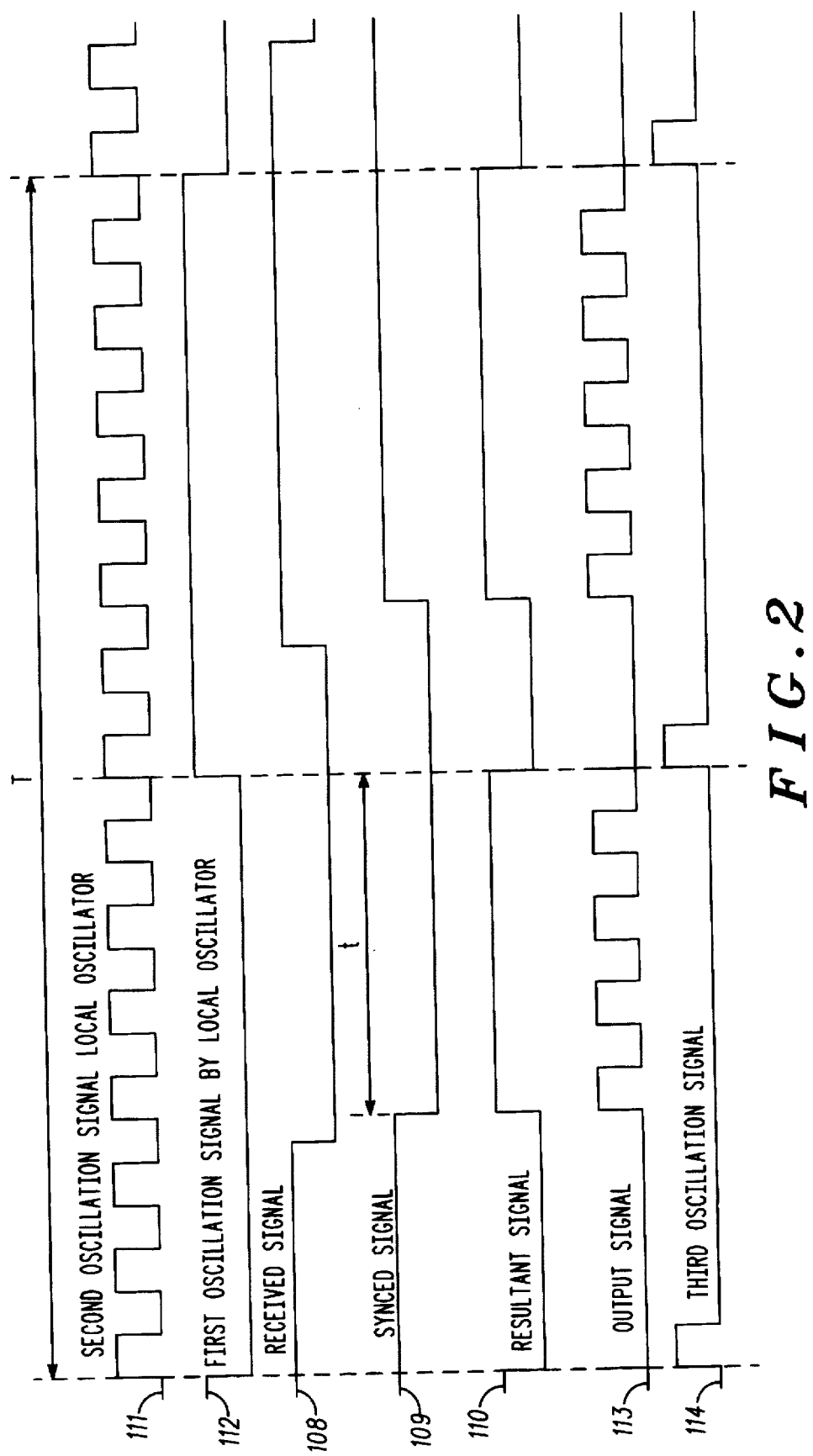

DIGITAL PHASE DETECTOR WITH INTEGRATED PHASE DETECTION

This is a continuation of application Ser. No. 08/197,087, filed Feb. 16, 1994 and now abandoned.

FIELD OF INVENTION

This invention relates generally to communication devices and, in particular, to detection and representation of a signal's phase in such communication devices.

BACKGROUND OF THE INVENTION

In a communication system, source information is modulated onto a carrier signal and transmitted over a channel where it is demodulated to reproduce the source information. Information is modulated onto a carrier signal by using amplitude modulation, phase modulation, frequency modulation or some combination of these. Amplitude modulation encodes the source information into different amplitudes of the carrier signal. Phase modulation encodes the source information into different phases of the carrier signal. Frequency modulation encodes the source information into slight frequency variations around the center frequency of the carrier signal.

In communication devices that employ phase modulation, such as Phase Shift Keying (PSK) or Quadrature Phase Shift Keying (QPSK), phase detection is needed to demodulate the source information. In addition, phase detection is used to demodulate frequency modulated information, since the phase and frequency are mathematically related. Phase-locked loops also use phase detection.

One known implementation of phase detection requires comparing the carrier signal with a reference signal using analog components such that the output voltage or current of the comparison is proportional to the difference in phase of the carrier signal and the reference signal. A digital representation of the output voltage or current is obtained by using an analog-to-digital converter. This solution requires analog components that are not easily integrated onto digital semiconductor devices. The analog components are also often required to be matched to prevent unacceptable errors.

In another known implementation of phase detection, the carrier signal is converted to a digital representation using an analog-to-digital converter before the signal is processed to determine the phase. The signal is digitally filtered into in-phase (I) and quadrature (Q) components and the arc tangent function is applied to the components to determine phase. The arc tangent function is often implemented using a memory look up table. This solution is complex, requires analog-to-digital conversion and requires the arc tangent function to be determined, which consumes a substantial amount of circuit area.

An all digital phase detector known in the art uses an N-bit digital counter for continuously generating a value. The counter is generally clocked by a signal that is $2^N$ times the frequency of the carrier signal. The digital counter is sampled at or near the edge transitions of the carrier signal to produce a numerical representation of phase. While this implementation overcomes its analog counterparts, it has its own limitations. For example, the continuous counter consumes a substantial amount of power, which limits its use in low power communication devices such as radios and telephones. In addition, edge transition detection on a noisy carrier signal is susceptible to error.

Therefore, a need exists to have a phase detection circuit that is completely digital thereby eliminating the need for analog components and analog-to-digital conversion and allowing integration of the phase detection with other digital components of the communication device. A need also exists for a simple digital phase detection circuit that consumes minimum power.

DESCRIPTION OF THE DRAWINGS

FIG. 2 illustrates a timing diagram of the digital phase detector shown in FIG. 1.

DESCRIPTION OF A PREFERRED EMBODIMENT

Generally, the present invention provides a method and apparatus for detecting and representing the phase of a signal. This is accomplished by comparing the phase of the signal to that of a reference local oscillator for each half cycle of the local oscillator. The signal and the local oscillator are the inputs of a one-bit digital multiplier that enables a counter. The counter produces a numerical output that represents for each half cycle of the local oscillator, the time that the local oscillator and signal are in the same state. This time is proportional to the magnitude of the phase. The sign of the phase is determined by examining whether the local oscillator and the signal are in the same state at the beginning or the end of each half cycle of the local oscillator. With such a method, low power phase detection is accomplished with a few off-the-shelf digital components and thus avoiding the problems of analog phase detection and complex digital phase detection.

Figure 1:
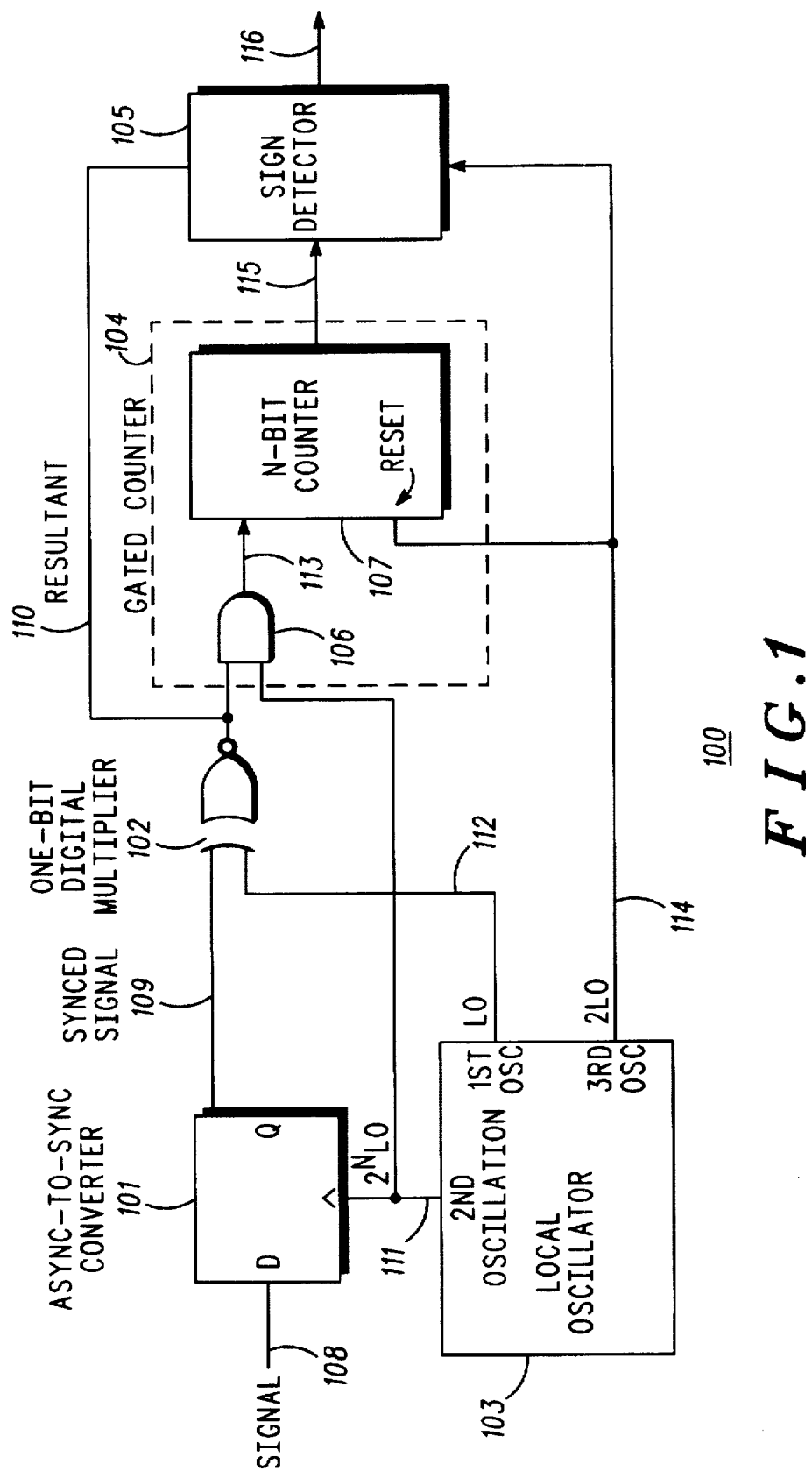
FIG. 1 illustrates a digital phase detector in accordance with the present invention.

The present invention is more fully described with reference to FIGS. 1–4. FIG. 1 illustrates a phase detector 100 that receives a signal 108 via an asynchronous-to-synchronous converter 101, which synchronizes the signal 108 with a second oscillation 111 produced by a local oscillator 103. The synchronized (synced) signal 109 is input into a one-bit digital multiplier 102 along with a first oscillation 112 produced by the local oscillator 103. The resultant 110 of the one-bit digital multiplier 102 indicates the sign of the phase. The resultant 110 also enables the gated counter 104 to count the number of periods of the second oscillation 111 that occur during the half cycle of the first oscillation 112. The output 115 of the gated counter 104 is a numerical representation of the magnitude of the phase of the signal. The sign detector 105 receives the resultant 110 and the output 115 of the gated counter 104 and produces a representation of the phase and polarity 116 of the signal 108.

The local oscillator 103 produces a first oscillation 112, a second oscillation 111, and a third oscillation 114. The first oscillation 112 is a reference signal representing zero phase. The third oscillation 114 is twice the frequency of the second oscillation 112. In a preferred embodiment, the third oscillation 114 is a short pulse that occurs at each transition of the first oscillation 112 and clears gated counter 104 and latches the sign of synced signal 109. The second oscillation 111 is a predetermined multiple of the first oscillation 112. In a preferred implementation, The second oscillation 111 is $2^N$ times the first oscillation 112, where N defines the size of the gated counter 104. A preferred range for N is 3 to 7.

The asynchronous-to-synchronous converter 101, which may be a D flip-flop such as the Motorola 74HC74, synchronizes the signal 108 with the second oscillation 111 to produces a synced signal 109. The second oscillation 111 is used because it is the highest frequency oscillation that is synchronous to all other oscillations. The purpose of the asynchronous-to-synchronous converter 101 is to ease timing constraints in down stream circuits and prevent possible metastability. The asynchronous-to-synchronous converter 101 could also consist of two or more flip-flops in series, with additional flip-flops further reducing the probability of encountering metastable conditions. Note that the asynchronous-to-synchronous converter 101 is not strictly necessary, but is a preferred implementation if the design is accomplished in an integrated circuit (IC).

The phase detector 100 further includes a one-bit digital multiplier 102 that multiplies the synced signal 109 with the first oscillation 112. The one-bit digital multiplier 102 is used to determine when the synced signal 109 and the first oscillation 112 are in the same state, i.e., when both are a logical "1" or both are a logical "0". This may be accomplished with an EXCLUSIVE-NOR gate such as the Motorola 74HC7266. Note that when the synced signal 109 and the first oscillation 112 are exactly in phase, the output of the one-bit digital multiplier 102 is constantly high. As the synced signal 109 changes phase, the duty cycle of the resultant 110 decreases in proportion to phase, reaching 0 when the synced signal 109 is in phase opposition with the first oscillation 112.

The resultant 110 of the one-bit digital multiplier 102 is input into a gated counter 104. The gated counter 104 is used to determine the duration per half cycle of the first oscillation 112 that resultant 110 is logically high. This is accomplished using an AND gate 106 and an N-bit counter 107. The resultant 110 and the second oscillation 111 form the inputs to the AND gate 106. The AND gate output signal 113, is low when resultant 110 is low, and equal to the second oscillation 111 when the resultant 110 is high. Therefore, the counter 107 is only clocked when the resultant 110 is high, hence counter 107 is gated by the resultant 110. Further, the third oscillation 114 is used to reset the counter 107 at each transition of the first oscillation 112. Therefore, the counter 107 counts the number of rising edges in the second oscillation 111 for which the resultant 110 is high per half cycle of the first oscillation 112. This gated counter 104 effectively measures the time that the resultant 110 is high during each half cycle of the first oscillation 112. As previously mentioned, this time is proportional to the magnitude of the phase of the synced signal. The AND gate 106 may be realized by standard CMOS gates such as the Motorola 74HC08. The counter 107 may be implemented by devices such as the Motorola 74HC4040. Both are easily implemented in integrated circuits. In practice, a counter may be clocked in a completely equivalent fashion by applying the second oscillation 111 to its clock input and the resultant 110 to its count enable input.

The output 115 of the gated counter 104 and the resultant 110 are input into a sign detector 105. The sign detector 105 is used to detect the sign of the phase of the synced signal 109 relative to the first oscillation 112 and operate on the output 115 of the gated counter 104 to change the magnitude only representation of the phase to a sign-magnitude representation. In many implementations it is also desirable to include a latch in this block to hold the phase value until the next value is computed, but this is not necessary in all implementations. A latch may also be implemented as a part of the counter 107. The latch may be triggered by the third oscillation 114. The sign detector 105 determines the sign of the synced signal 109 by sampling the resultant 110 at each transition of the first oscillation 112. If the synced signal 109 leads the first oscillation 112 in phase, then the resultant 110 is low at each transition of the first oscillation 112. If the synced signal 109 lags the first oscillation 112 in phase, then the resultant 110 is high at each transition of the first oscillation 112. In a preferred embodiment, sampling of the resultant 110 is accomplished using a D flip-flop such as the Motorola 74HC74 with the clock input coupled to the third oscillation 114 and the D input coupled to the resultant 110. The output of this flip-flop is used to numerically invert the output of the counter 107 when the synced signal 109 has a negative phase and to pass the value of the counter 107 when the phase of the synced signal 109 is positive. The exact implementation of this function depends on the desired format of the output. For two's compliment output, this may be accomplished with a multiplexer such as the Motorola 74HC157 and an adder.

FIG. 2 illustrates a timing diagram of the phase detector 100 shown in FIG. 1. The signal 108 is a limited representation of the input signal. The synced signal 109 is a synchronous representation of the limited input signal. Note that the synced signal 109 transitions from one state to another at the first rising edge of the second oscillation 111 following a change in state of the input signal 108. Therefore, the synced signal 109 is a temporally quantized version of the signal 108. Furthermore, because the step size of this quantization is determined by the period of the second oscillation 111, increasing the frequency of the second oscillation 111 will decrease the step size of the temporal quantization. The local oscillator 103 produces the first oscillation 112 to provide a reference signal of zero phase. Therefore the first oscillation 112 should be of a frequency relatively close to that of the signal 108.

The synced signal 109 shown in FIG. 2, lags the first oscillation 112 in phase. This is because a transition in the synced signal 109 follows the corresponding transition in the first oscillation 112 by an amount between 0 and ½ cycle of the first oscillation 112. When this occurs, it is customary to define the phase of the synced signal 109 as negative relative to the first oscillation 112. Conversely, if a transition in the synced signal 109 occurred in the half cycle of the first oscillation 112 preceding the corresponding transition in the first oscillation 112, the phase of the synced signal 109 would possess a positive phase relative to the first oscillation 112. The resultant 110 is the EXCLUSIVE-NOR of the first oscillation 112 and the synced signal 109. The EXCLUSIVE-NOR function is a logical "1" when the synced signal 109 and the first oscillation 112 are in the same state, and is a logical "0" when these two signals differ in state. When the synced signal 109 has a negative phase relative to the first oscillation 112, the signal 109 is in the same state as oscillation 112 for some period preceding every transition in the first oscillation 112. Therefore, the resultant 110 is high for some period preceding the transition in the first oscillation 112. If the phase of the synced signal 109 is positive relative to the first oscillation 112, the synced signal 109 is in the opposite state of the first oscillation 112 for some period preceding every transition in the first oscillation 112. Therefore, the resultant 110 is low for some period preceding the transition in the first oscillation 112. This property of the resultant 110 is used to determine the polarity of the phase of the synced signal 109 by sampling the resultant 110 at each transition of the first oscillation 112. This sampling is accomplished in the sign detector 105 with a D flip-flop. The flip-flop is clocked by the third oscillation 114, which has a rising edge that is coincident with the transitions of the first oscillation 112.

The magnitude of the phase of the synced signal 109 relative to the first oscillation 112 is a measure of the temporal separation of corresponding transitions in these two signals relative to the period of the first oscillation 112. This separation is computed using modular arithmetic with a modulo representing a half cycle of the first oscillation 112. As shown in FIG. 2, the magnitude of the phase of the synced signal 109 is said to be (pi·t)/T radians. The quantity "t" is determined by measuring the time that the first oscillation 112 and the synced signal 109 are in the same state in a given half cycle of the first oscillation 112. This is equivalent to measuring the time that the resultant 110 is high over the half cycle. Note that the units used to measure t and T are irrelevant. Therefore, by counting the number of cycles of the second oscillation 111 that occur in the period t, the magnitude of the phase of the synced signal 109 relative to the first oscillation 112 is determined to within a constant multiple. Because a known number of periods of the second oscillation 111 occur in the interval T, this constant is also known. The interval t is determined by this method every half cycle of the first oscillation 112. Therefore, samples of the magnitude of the phase of the synced signal 109 are obtained at twice the frequency of the first oscillation 112. Determining the number of cycles of the second oscillation 111 that occur in the period t is accomplished using the gated counter 104. This counter is reset at each transition of the first oscillation 112 and counts the number of rising or falling edges of the second oscillation 111 that occur when the resultant 110 is high. Counting the number of edges that occur while the resultant 110 is high is accomplished by performing the logical AND of the second oscillation 111 and the resultant 110 and using this signal 113 as the clock input of the counter 107. The third oscillation 114 is used to reset the counter 107. In a preferred embodiment, this signal is of short duration to allow the counter 107 to respond to the edge of the output of the AND gate 113 that occurs shortly after a transition in the first oscillation 112. The second oscillation 111 is at a frequency $2^N$ times the first oscillation 112. Therefore, $2^N-1$ cycles of the second oscillation 111 occur in a half cycle of the first oscillation 112. The quantity $2^N-1$ defines the number of steps resolvable in the magnitude of phase.

Figure 3:
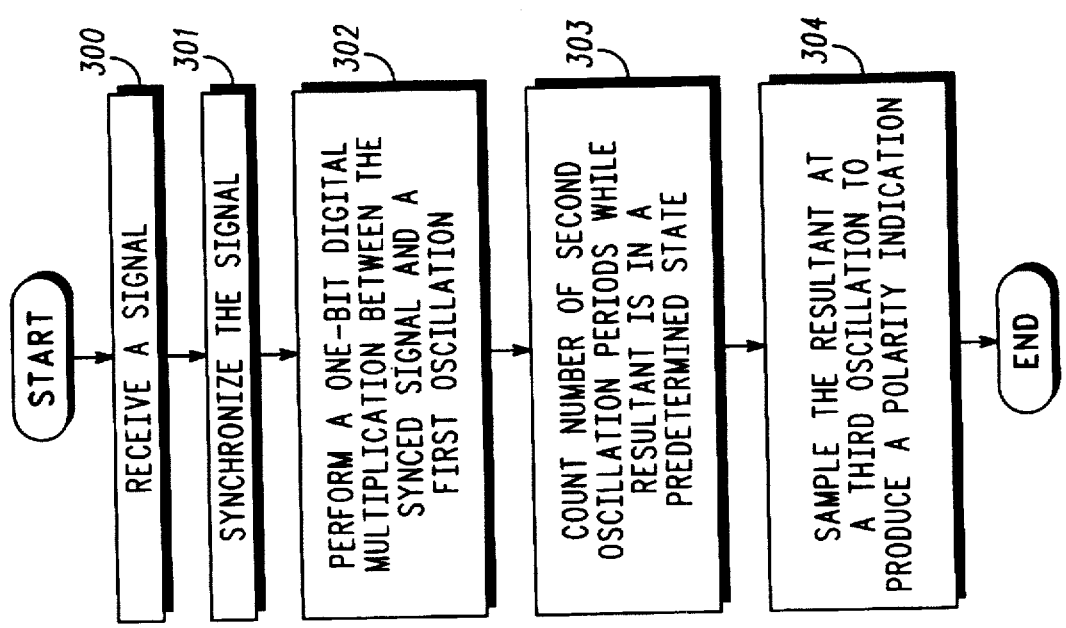
FIG. 3 illustrates a flow diagram for a method of detecting phase in accordance with the present invention.

FIG. 3 illustrates a flow diagram that may be used by a digital processor, or other digital programmable device, to implement the present invention. At step 300, a signal is received. This signal is typically a hard limited representation of a modulated sinusoidal carrier that has a spectrum centered at some non-zero frequency and which occupies a bandwidth that is relatively small compared to the center frequency. This signal is synced to a local oscillator 301. In a preferred embodiment, this step is accomplished by coupling the signal to a D flip-flop and clocking the D flip flop with a second oscillation.

In step 302, the synced signal is then multiplied with a reference first oscillation. This first oscillation is preferably near the center frequency of the signal received in step 300. This multiplication is performed on two one-bit signals and may therefore be accomplished by EXCLUSIVE-NORing the signals. The EXCLUSIVE-NOR function produces a high output when both inputs are in the same state. Consider one half cycle of the first oscillation. For this half cycle, the first oscillation is in a given state, either high or low. The synced signal causes the output of the EXCLUSIVE-NOR function to be high when the synced signal is in the same state as the first oscillation. When the synced signal is exactly in phase with the first oscillation, the two are in the same state for the entire half cycle of the first oscillation; therefore the output of the EXCLUSIVE-NOR function is high for the entire half cycle. As the phase of the synced signal deviates from zero, the synced signal and the first oscillation are in the same state for some portion of the half cycle and in different states for the remainder. Therefore, the EXCLUSIVE-NOR function is high for the portion of the half cycle that the synced signal and the first oscillation are in the same state. Further, the portion of the half cycle that the synced signal and the first oscillation are in the same state is related to phase. As the phase moves further from zero, the time that the resultant of the EXCLUSIVE-NOR function is high decreases in a linear manner. This time is therefore linearly related to the magnitude of the phase of the synced signal.

In step 303, the portion of the half cycle in which the resultant of step 302 is high is determined. As mentioned, this value is closely related to the phase of the signal received in step 300 relative to a reference local oscillation. The time that the output of step 302 is high is measured by resetting a counter at the start of each half cycle of a first oscillation and counting the number of cycles of a second oscillation that the resultant of step 302 is high. This second oscillation is preferably at a much higher frequency than the first oscillation. In most implementations this second oscillation frequency is a power of 2 times the first oscillation frequency, though this is not required.

The resultant of step 302 is also used to determine the polarity of the synced signal generated in step 301. This is accomplished in step 304. Again consider one half cycle of the first oscillation in step 302. Consider the case where the synced signal and the first oscillation are exactly in phase. In this situation, each transition of the two signals exactly lines up, and the two signals are always in the same state. As the phase of the synced signal becomes positive, the transitions of the synced signal occur before the corresponding transition of the first oscillation. Therefore, there is some time before a transition of the first oscillation that the synced signal and the first oscillation are in the opposite state. The result of the EXCLUSIVE-NOR is low for this time. When the phase of the synced signal is negative, the transition of the synced signal occur after the corresponding transitions of the first oscillation. Therefore there is some time before a transition of the first oscillation that the synced signal and the first oscillation are in the same state. The result of the EXCLUSIVE-NOR operation is high for this time. The result of the EXCLUSIVE-NOR is therefore sampled at each transition of the first oscillation to determine the polarity of the phase of the synced signal. A third oscillation is generated to sample the result of step 302 at each transition of the local oscillator. This is preferably accomplished by generating a signal at twice the frequency of the first oscillation that has a rising edge coincident with every transition of the first oscillation. This signal is referred to as the third oscillation in step 304. Step 304 also consists of combining the magnitude of the phase produced in step 303 with this polarity information to produce a complete representation of the phase. A two's complement or other valid digital representation is possible.

Figure 4:
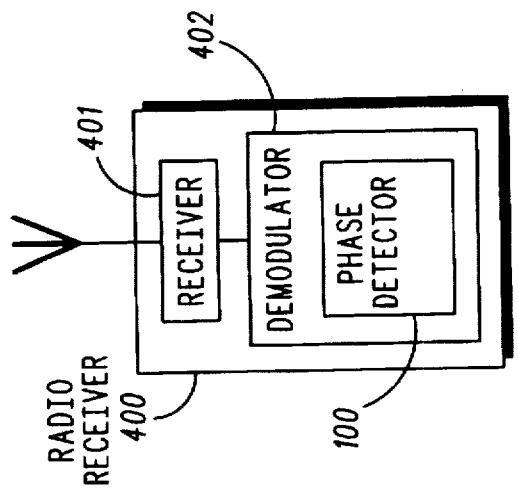
FIG. 4 illustrates a radio receiver employing a phase detector in accordance with the present invention.

FIG. 4 illustrates a radio receiver 400 that includes a receiver 401 and a demodulator 402, that includes a phase detector 100. Typically, receiver 401 consists of an antenna followed by stages of amplification and frequency conversions. A hard limiter follows these stages. The hard limiter eliminates the need for automatic gain control. The limited signal produced by the hard limiter contains no information about the magnitude of the received signal, but preserves phase and frequency information. For modulation techniques that only contain information in the phase of the signal, such as M-ary PSK and frequency modulation, there is only a small degradation in sensitivity caused by ignoring the amplitude of the received signal.

Generally, phase detector 100 is a first step in demodulator 402. The remaining sections of the demodulator consist of circuitry to correct for frequency offsets, extract timing information, and extract the modulated information from the digitized phase values produced by the phase detector. Many methods exist to perform these functions. Frequency offset is often detected by noting that a frequency offset appears as a linear ramp in phase. Once detected, this ramp is subtracted from the sampled phase values to correct the frequency offset. Phase-locked loops are also used alone or in conjunction with this method to correct frequency offsets. Optimum timing recovery depends largely on the type of modulation used. Many efficient methods exist to perform timing recovery. Detecting the modulated information consists of mapping the phase or change in phase at the optimal sample time to the appropriate bits for M-ary PSK modulation or detecting the frequency shift for frequency modulation.

The present invention allows the development of a single IC that can accept a limited intermediate frequency (IF) input and produce a demodulated bit stream as an output. This is not feasible using analog techniques to perform phase detection. In the family of digital phase detectors that use a continuous counter, the counter accounts for a large percentage of the gates. The present invention uses a gated counter that has a mean duty cycle of 50% for virtually all forms of modulation. This is in contrast to a 100% duty cycle for continuous counter implementations used in the prior art. The reduction in duty cycle of the counter produces a similar reduction in power consumption. Furthermore, the phase detector described herein is an integrating device while the prior art uses edge detection. The integrating effect makes the present invention more robust to many manifestations of channel noise typical in a limited IF signal.

We claim:

1. A phase detector comprising:
   a local oscillator that produces a first oscillation and a second oscillation, wherein the second oscillation is a predetermined multiple of the first oscillation;
   a one-bit digital multiplier having a first input coupled to receive the first oscillation and a second input coupled to receive a signal; and
   a gated counter coupled to receive an output of the one-bit digital multiplier and the second oscillation to produce a representation of phase of the signal and the gated counter comprises:
   an AND gate having a first input coupled to the output of the one-bit multiplier and a second input coupled to the second oscillation: and
   an N-bit counter having a count input coupled to receive an output of the AND gate and having a reset input coupled to receive a third oscillation, wherein the third oscillation is approximately twice the first oscillation.

2. The phase detector of claim 1 wherein the one-bit digital multiplier comprises an EXCLUSIVE-OR gate.

3. The phase detector of claim 1 wherein the one-bit digital multiplier comprises an EXCLUSIVE-NOR gate.

4. The phase detector of claim 1 wherein the predetermined multiple of the local oscillator comprises a ratio of approximately $2^N$, where N is an integer.

5. The phase detector of claim 1 further comprises an asynchronous-to-synchronous converter that produces the signal.

6. The phase detector of claim 5 wherein the asynchronous-to-synchronous converter comprises a flip-flop.

7. The phase detector of claim 1 further comprises a sign detector coupled to receive the representation of phase of the signal and the output of the one-bit multiplier to produce a polarity indication of the representation of phase of the signal.

8. A radio receiver that includes:
   a receiver that receives a signal to produce a received signal; and
   a demodulator operably coupled to the receiver that includes a phase detector, wherein the phase detector comprises:
   a local oscillator that produces a first oscillation and a second oscillation, wherein the second oscillation is a predetermined multiple of the first oscillation;
   a one-bit digital multiplier having a first input coupled to receive the first oscillation and a second input coupled to receive a signal; and
   a gated counter coupled to receive an output of the one-bit digital multiplier and the second oscillation to produce a representation of phase of the signal and the gated counter comprises:
   an AND gate having a first input coupled to the output of the one-bit multiplier and a second input coupled to the second oscillation: and
   an N-bit counter having a count input coupled to receive an output of the AND gate and having a reset input coupled to receive a third oscillation, wherein the third oscillation is approximately twice the first oscillation.

* * * * *